United States Patent [19]

Woolhouse et al.

[11] 4,237,601
[45] Dec. 9, 1980

[54] METHOD OF CLEAVING SEMICONDUCTOR DIODE LASER WAFERS

[75] Inventors: Geoffrey R. Woolhouse, White Plains; Harold A. Huggins, Hartsdale, both of N.Y.; David W. Collins, Watchung, N.J.

[73] Assignee: Exxon Research & Engineering Co., Florham Park, N.J.

[21] Appl. No.: 951,064

[22] Filed: Oct. 13, 1978

[51] Int. Cl.$^3$ .............................................. B01J 17/00
[52] U.S. Cl. .................................... 29/583; 29/569 L; 29/580
[58] Field of Search ....................... 29/580, 583, 569 L

[56] References Cited

U.S. PATENT DOCUMENTS

| | | | |
|---|---|---|---|
| 3,054,709 | 9/1962 | Freestone | 29/583 |
| 3,332,143 | 7/1967 | Gentry | 29/583 |
| 3,673,016 | 6/1972 | Gerstner | 29/583 |

OTHER PUBLICATIONS

Electrochemical Society Journal, "Selective Etching of GaAs Crystals in $H_2SO_4$–$H_2O_2$–$H_2O$ Systems", Lida et al., vol. 118, pp. 468–771, 1971.

Primary Examiner—W. C. Tupman
Attorney, Agent, or Firm—David W. Collins; Paul E. Purwin

[57] ABSTRACT

Thick double heterostructure (Al,Ga)As wafers comprising layers of gallium arsenide and gallium aluminum arsenide on a metallized n-GaAs substrate are separated into individual devices for use as diode lasers. In contrast to prior art techniques employed with thinner wafers of mechanically cleaving the wafer in mutually orthogonal directions, the wafer is first separated into bars of diodes by a process which comprises (a) forming channels of substantially parallel sidewalls about 1 to 4 mils deep into the surface of the n-GaAs substrate (b) etching into the n-GaAs substrate with an anisotropic etchant to a depth sufficient to form V-grooves in the bottom of the channels and (c) mechanically cleaving into bars of diodes. The cleaving may be done by prior art techniques using a knife, razor blade or tweezer edge or by attaching the side of the wafer opposite to the V-grooves to a flexible adhesive tape and rolling the assembly in a manner such as over a tool of small radius.

The diode bars may then, following passivation, be further cleaved into individual diodes by the prior art technique of mechanically scribing and cleaving. Processing in accordance with the invention results in good length definition and uniformity, high device yields and low density of striations on laser facets. The inventive process permits handling of thicker wafers on the order of 6 to 10 mils or so, which are cleaved only with great difficulty by prior art techniques. Such thicker wafers are less susceptible to breaking during handling and permit fabrication of shorter diode (cavity) length, which in turn is related to lower threshold current for device operation.

17 Claims, 4 Drawing Figures

METHOD OF CLEAVING SEMICONDUCTOR DIODE LASER WAFERS

BACKGROUND OF THE INVENTION

1. Field of the Invention

The invention is related to diode lasers, and, more particularly, to separating diode lasers from wafers.

2. Discussion of the Prior Art

Coherent light-emitting diodes having a GaAs-(Al,Ga)As double heterostructure, such as described in "Semiconductor Lasers and Heterojunction LED's" by H. Kressel and J. K. Butler, Academic Press, New York, 1977, are known to be efficient light sources for optical communication systems.

As is well-known, such diode lasers comprise layers of GaAs and (Al,Ga)As on an n-GaAs substrate. The final layer is a cap layer of p-GaAs. Metallized stripes, parallel to the intended direction of lasing, are deposited on a p-side of the wafer. Gold contact pads, somewhat smaller in area than the intended size of the diode laser, are deposited on the n-side of the wafer. The stripes and pads are for subsequent connection to an external electrical source.

The wafer is then cut into two mutually orthogonal directions to form the individual diodes. First, the wafer is cut perpendicular to the intended lasing facets into bars of diodes, then the bars of diodes, following passivation of lasing facets, are cut into individual diodes.

Cutting of the wafer into bars is generally accomplished by cleaving the wafer through the substrate side, using an instrument such as a razor blade, knife, scapel blade or the like. Control over length of the diode laser is consequently poor, and variation of diode laser length is great, with the result that longitudinal mode distribution and threshold current vary considerably from one diode laser to the next. Further, the gold contact pads must be kept thin in order to permit reasonably clean cleaving. Also, the thickness of the substrate is constrained in order to promote better cleaving. This limits useful wafer thicknesses to about 3 to 5 mils. Yet, such thin wafers are highly susceptible to breaking during handling. Finally, striations generated by the mechanical cleaving, if across the active lasing region, affect dvice yield, since such devices are consequently prone to degradation.

In a related patent application, Ser. No. 951,074, an etch method of cleaving semiconductor diode wafers is disclosed and claimed. The wafer is first separated into bars of diodes by a process which comprises (a) forming an array of exposed lines on the n-side by photolithography to define the lasing ends of the diodes, (b) etching through the exposed metallized portion to expose portions of the underlying n-GaAs, (c) etching into the n-GaAs substrate with a V-groove etchant to a distance of about 1 to 2 mils less than the total thickness of the wafer and (d) mechanically cleaving into bars of diodes. The disclosed technique is useful for wafers having a total thickness of about 3 to 5 mils and long cavity lengths (about 10 mils or greater). For thicker wafers, such as about 6 to 10 mils in thickness, however, etching with a V-groove etchant consumes too much of the surface of the n-substrate, thus making contact to the n-side difficult. On the other hand, the disclosed technique does result in improved length definition and uniformity, in increased device yields and in reduced striations on lasing facets, and thus represents a substantial improvement over prior art techniques. A need, however, remains in the art for a method of cleaving semiconductor diode lasers from relatively thick wafers.

SUMMARY OF THE INVENTION

In accordance with the invention, a wafer comprising a semiconductor substrate, at least a portion of one surface of which is metallized, and a plurality of semiconductor layers deposited on at least a portion of the opposite surface, at least one of which layers when appropriately biased generates coherent electromagnetic radiation, is cleaved into bars of diodes by a process which comprises (a) forming channels of substantially parallel sidewalls about 1 to 4 mils deep in the surface of the n-substrate, (b) etching into the substrate with an anisotropic etchant to a depth sufficient to form V-grooves in the bottom of the channels and (c) mechanically cleaving the bars of diodes.

As a consequence of the process of the invention, good cleavage control, substantially damage-free facets along the plane of cleaving and substantially uniform definition of diode laser length are obtained. Considerably thicker wafers than heretofore possible may be processed by the inventive technique. Such thicker wafers are easier to handle and are thus less susceptible to breaking. Such thicker wafers also allow fabrication of shorter diode lengths, which in turn leads to lower threshold current.

DETAILED DESCRIPTION OF THE INVENTION

The description that follows is given generally in terms of double heterostructure (DH), (Al, Ga)As diode lasers having a stripe geometry. However, it will be appreciated that other configurations and other geometries of both gallium arsenide diode lasers, as well as other semiconductor diode lasers, may also be beneficially processed following the teachings herein. Such devices may generate coherent electromagnetic radiation in the UV, visible or IR regions.

Figure 1A:
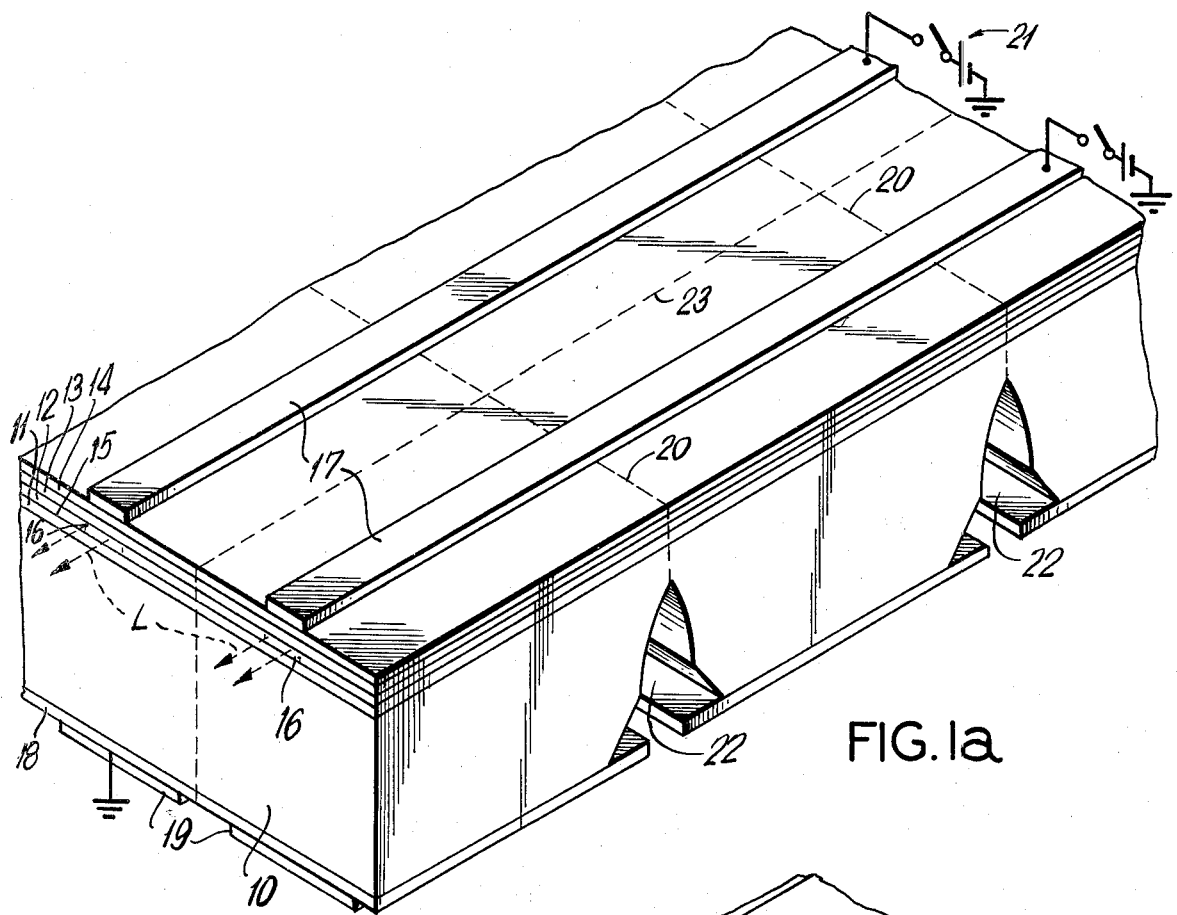
FIGS. 1a and 1b, in perspective, depict a portion of a wafer following formation of channels and etching of V-grooves in accordance with the invention prior to mechanical cleaving into diode bars.
Figure 1B:
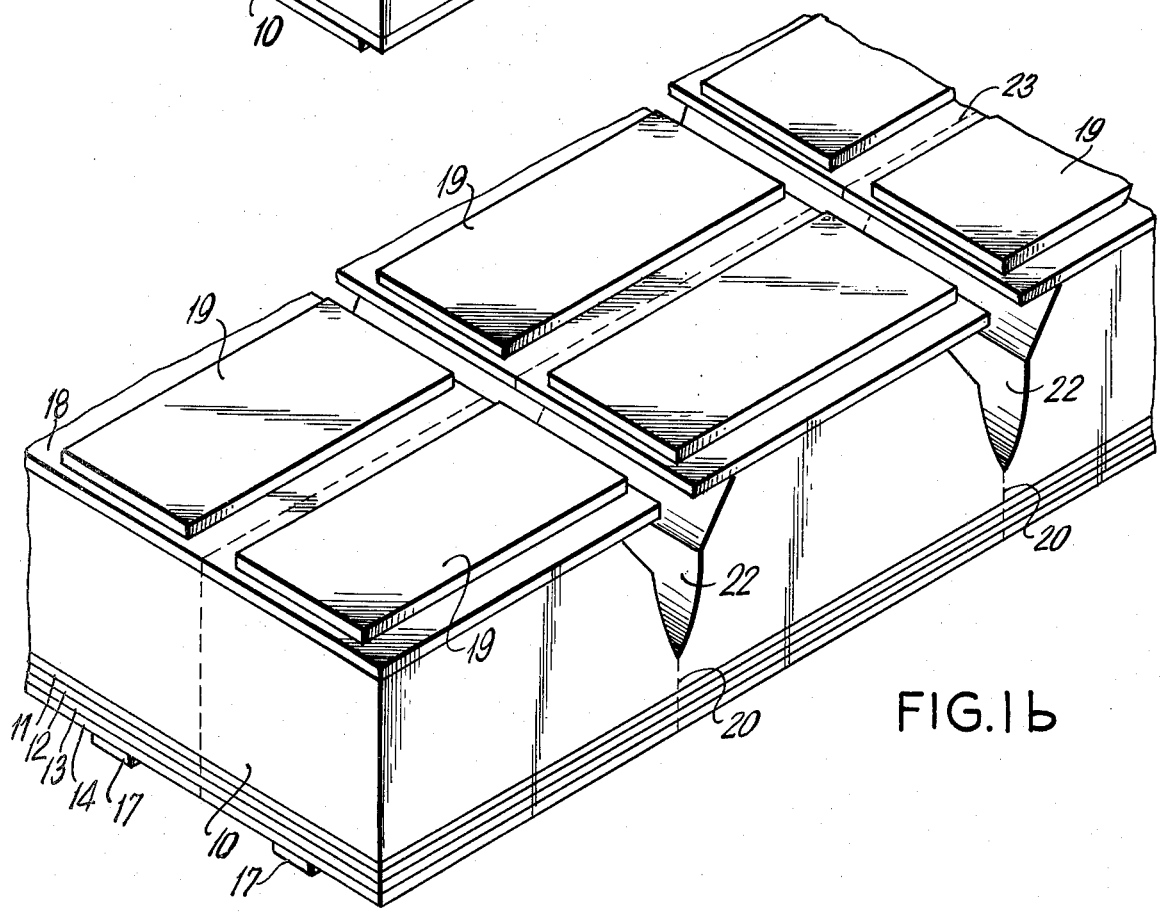

FIGS. 1a and 1b depict a portion of a wafer, considerably enlarged for purposes of illustration, from which a plurality of DH diode lasers are to be fabricated. FIG. 1a, shows the wafer n-side down, and FIG. 1b shows the wafer p-side down. The wafer includes an n-type GaAs substrate 10 on at least a portion of which are normally grown four successive layers 11, 12, 13 and 14, respectively, of n-(Al,Ga)As, p-GaAs, p-(Al,Ga)As and p-GaAs. Layers 11 and 12 form a p-n junction region 15, with central areas 16 in layer 12 providing light-emitting areas. The layers are conveniently formed one over the other in one run by liquid phase epitaxy, using diffusion techniques and a horizontal sliding boat apparatus containing four melts, as is well-known. Metal electrodes 17 in the form of stripes parallel to the intended direction of lasing are deposited through conventional photolithography techniques onto top layer 14 and provide means for external contact. A metal layer 18 is deposited on at least a portion of the bottom of the substrate 10. Gold pads 19, somewhat smaller in area than the intended device, are formed on layer 18, and provide means for external contact. When cleaved into individual devices, as shown by dotted lines 20, planar mirror facets are formed along (110) planes. When current above a threshold value from a battery 21 is sent to a selected electrode 17, light L is emitted from the facet on the p-n junction 16, such p-n junction lying in a plane that is perpendicular to the direction of current flow from electrode 17 to electrode 18. That is, the cavity of the laser structure is bounded by the two cleaved facets, and the laser light is emitted from the facets in a direction approximately perpendicular to the direction of current flow. The necessary reflectivity of the cavity facets is provided by the discontinuity of the index of refraction between the semiconducting materials and air.

In the conventional fabrication of DH (Al,Ga)As diode lasers, the wafer comprises a substrate 10 of n-GaAs, typically about 3 to 5 mils thick and having a carrier concentration ranging from about 1 to $3 \times 10^{18}$ cm$^{-3}$, usually doped with silicon. While thicker substrates are desirable, the typical thicknesses given above are the result of the constraints posed by prior art techniques of cleaving wafers. Such thin wafers, however, are very fragile and often break during handling. The inventive technique discussed in further detail below is particularly useful for thicker wafers, such as those on the order of 6 to 10 mils and thicker.

Layers 11 and 13 of n-(Al,Ga)As and p-(Al,Ga)As, respectively, are typically about 0.75 to 2 $\mu$m thick, with both layers having a value of x (Al$_x$Ga$_{1-x}$As) of about 0.30 to 0.35. Layer 11 is typically doped with tin, while layer 13 is typically doped with germanium. Active layer 12, of either p-GaAs or p-(Al,Ga)As, is typically about 0.1 to 0.3 $\mu$m thick and is undoped. If layer 12 is p-(Al,Ga)As, then the value of y (Al$_y$Ga$_{1-y}$As) ranges from about 0.05 to 0.10. Cap layer 14 of p-GaAs is typically about 0.2 to 0.5 $\mu$m thick and provides a layer to which ohmic contact may be made. The carrier concentration of layer 14, provided by germanium, is typically about 1 to $3 \times 10^{19}$ cm$^{-3}$. Metallic ohmic contacts 17 in stripe form are deposited onto layer 14 by conventional photolithographic techniques employing electroless nickel plating having a thickness ranging from about 0.05 to 0.07 $\mu$m, followed by about 1000 Å of electroplated gold. Ohmic contact 18 is formed by evaporation of, e.g., 3% silver/97% tin alloy onto the bottom of said substrate 10 and typically has a thickness ranging from about 0.18 to 0.28 $\mu$m. Gold pads 19, formed by electroplating through a photoresist mask, typically are about 2 to 3 $\mu$m thick.

Following the foregoing procedure, the wafer is first cleaved into bars of diodes by cleaving the wafer through the substrate side, perpendicular to lasing facets, along lines 20, which lie between gold pads 19. However, the regions covered by the gold pads are locally strained, and cleavage is unpredictable, with the consequence that prior art mechanical cleaving techniques, such as a knife, razor blade or other instrument, result in diode bars of uneven length. Variations in diode laser length affects longitudinal distribution and threshold current, with the result that these values can differ considerably for diode lasers taken from different locations in the same wafer. Also, the diode bars are subsequently place in a fixture for evaporation of a film of Al$_2$O$_3$ of about 1200 Å in thickness to passivate lasing facets. If the diode bars are too long (as measured between lines 20 in FIG. 1a), then the diode bars cannot be placed in the fixture. If too short, then, due to a shadowing effect, the lasing facets are not properly passivated.

Another consequence of prior art mechanical cleaving is that the gold pads must be kept thin, as must the substrate in order to maximize yield of diode lasers. Yet, thin gold pads are bound only with difficulty when connecting to an external power source, and thin substrates render handling of the wafer difficult. Further, such mechanical cleavage often generates striations (damage), which, when formed across the active region, can lead to increased degradation of the devices, with consequent low device yield.

Figure 2A:
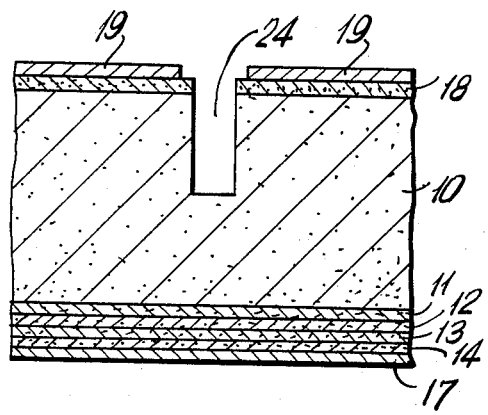
FIGS. 2a and 2b depict a portion of a wafer in cross-section, following formation of channels and V-grooves, respectively.

In accordance with the invention, diode lasers are fabricated from relatively thick wafers by the following procedure. A channel 24 of substantially parallel sidewalls is formed in the exposed surface of the n-substrate, as shown in cross-section in FIG. 2a. The channels are about 1 to 4 mils deep. If the channels are not deep enough, then the subsequent etching step, described below, results in considerable loss in surface area of the substrate. If the channels are too deep, then the V-groove formed by etching in the subsequent step will not be fully formed, and thus cleaving is initiated beyond the substrate and in the region of the epitaxial layers, and will not result in a mirror facet.

The channels are conveniently formed using a diamond circular saw blade about 1.5 to 2 mils in thickness. While other techniques may be used, the diamond circular saw blade, which is extensively used in semiconductor processing techniques for other purposes, advantageously forms channels having substantially parallel sidewalls. Due to the increased thickness of the wafer, no dislocations are generated in the active region, which is a problem that generally accompanies use of diamond saw blades with thinner wafers.

Figure 2B:
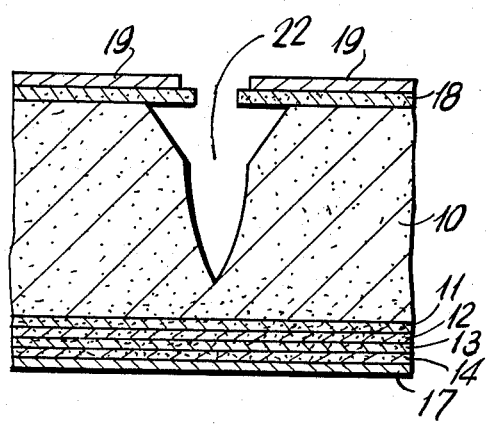

Grooves are then etched into the bottoms of the channels with an anisotropic etchant that forms V-grooves 22, as shown in cross-section in FIG. 2b. When the substrate is gallium arsenide, an example of such an etchant comprises a solution of H$_2$SO$_4$, H$_2$O$_2$ and H$_2$O. The exact details of a successful etchant for producing V-groove 22 as shown in FIGS. 1a and 1b are described in a paper entitled "Selective Etching of Gallium Arsenide Crystals in H$_2$SO$_4$-H$_2$O$_2$-H$_2$O Systems" by S. Iida et al. in Volume 118, Electrochemical Society Journal, pages 468-771(1971), and form no part of this invention. An example of an etchant that produces a V-groove is 1H$_2$SO$_4$-8H$_2$O$_2$-1H$_2$O, in which the concentration of H$_2$SO$_4$ is a 98% solution by weight and the concentration of H$_2$O$_2$ is a 30% solution by weight, whereas the formula concentration is by volume. The 1-8-1 solution at a temperature of 25° C. is able to etch through the GaAs layer at a rate of about 4 $\mu$m/min. The etchant in this concentration produces a V-shaped channel in GaAs with sidewalls having an angle of 54°34' with respect to the plane of the wafer when the etch is formed on the (001) surface along the <011> direction which gives V-grooves. The etching solution is quenched as soon as the desired amount of etching has taken place. Other etchants, whether chemical or gaseous, which also give rise to similar V-grooves, may also be employed. A relatively steep sidewall, such as 54°44', is preferred to shallower sidewalls of, say, less than 45°, in order to conserve substrate material on the etched side of the wafer.

Of course, the rate of etching can be increased by increasing the temperature of the etchant. Further, the etchant can be agitated such as by ultrasonic agitation in order to reduce diffusion-limited effects created by the size of the channels. The etchant is selected according to the crystal orientation of the material, as described above. Thus, the orientation of the wafer should be such that a V-groove configuration is obtained, rather than a round bottom configuration. The reason for this is that the bottom of the V-groove provides a precise location for initiation of cleaving, which in turn results in fabrication of individual diode lasers of precise length.

The etching is carried out to a depth sufficient to form a V-groove. If the etching is not deep enough to form the V-groove, then cleaving is more difficult, since the cleavage plane is not well-defined and cleavage striations are more likely to occur across lasing facets, as with prior art techniques. If the etching is too deep, the cleaving is initiated beyond the substrate and in the region of the epitaxial layers, and will not result in a mirror facet. The V-groove in the bottom of the channel is generally well-formed about 1 to 3 mils deeper than the initial channel, and etching may be terminated at that point.

Following etching, which, as shown in FIGS. 1a, 1b and 2b produces a V-groove 22 in the bottom of channel 24, the wafer is mechanically cleaved by rolling or other means so as to produce cleavages along lines 20. A knife, razor blade or other sharp instrument may be used from the n-side for cleaving, resulting in diode bars of prescribed uniform length with good cleaved surfaces. Alternatively, a convenient technique is to mount the wafer, p-side up, on a flexible adhesive tape to roll the assembly over a small radius tool, such as disclosed in U.S. Pat. No. 3,497,948. Most preferred is to simply cleave from the p-side by pressing down over the V-grooves with a blunt instrument such as a tweezer edge. This method is fast and accurate. The combination of forming channels and etching V-grooves in the substrate to the specified depth ranges, followed by mechanical cleavage, results in substantially striation-free facets.

Following cleaving into diode bars and passivation of lasing facets, individual diodes are formed by scribing the bars, as with a diamond scribe, usually on the n-side, along lines 23 (the wafer having previously been indexed by well-known means to locate stripes 17). The scribed bars are then mechanically cleaved by rolling a tool of small radius over the bars, as is customary in the art.

The foregoing method results in good cleavage control and uniform definition of diode laser length. Consequently, longitudinal mode distribution and threshold current exhibit little variation for devices taken from different locations in the wafer. Cleavage to prescribed lengths results in easier processability for lasing facet passivation and in improved device yields. High yields of diode lasers from the wafers are realized by using the method of the invention. Cleaving through thin GaAs (from the bottom of the V-groove to the p-side) results in minimal cleavage striations on the lasing facet. An additional benefit of the invention is that gold contact pads 19 may be made thicker without affecting the quality of cleaved surface. Such thicker contacts permit better ease of contacting to an external power source. The method of the invention is especially efficacious for thicker substrates than heretobefore possible, thereby increasing ease of handling and ease of fabrication of shorter diode (cavity) lengths. Such shorter diode laser lengths, on the order of about 6 mils, permit lowering of the threshold current over that customarily found in the art.

EXAMPLE

Processed wafers were lapped on the n-side to 8 mils. A coating of 3% Ag/97% Sn was evaporated on the lapped side to a thickness of 1900 Å. A nickel film of 2000 Å μm was electroless plated on the Ag-Sn coating, followed by a gold film of 500 Å. A thin layer of chromium (700 Å), followed by a thin layer of gold (1000 Å), was evaporated on the opposite side.

The wafer was sawed from the n-side to a depth of 2 mils using a diamond blade of 1.5 to 2.0 mil thickness. After sawing, the sample was etched in a V-groove etchant comprising $1H_2SO_4-8H_2O_2-1H_2O$ (by volume) for 10 min. at room temperature to a depth of 4.3 mils from the substrate surface (2.3 mils deeper than the initial channel). Cleaving was done by pressing with tweezers in the direction of the desired cleave.

The cleavage yields were measured in terms of the number of useful bars obtained expressed as a percentage of the total amount of material. The cleavage striation densities were measured by Nomarski optical examination of 5 mm lengths of samples representative of the cleaving. No comparison was made using prior art techniques with wafers about 8 mils thick, since such wafers cannot be controllably cleaved by scribing and mechanically cleaving. A comparison could be made, however, with wafers about 4 mils thick cleaved by conventional prior art techniques. The results are shown in the Table below.

|  | Prior Art Cleaving | Cleaving in Accordance with Invention |
| --- | --- | --- |
| % Yield | 10;20 | 100 |
| Cleavage Striation Density, $mm^{-1}$ | 300 | 8 |

It can be seen that yields were improved by a factor of 5 to 10 and cleavage striation density was reduced by a factor of nearly 40 employing the inventive technique. The comparison presumably would be even greater if thick wafers could be cleaved by prior art techniques.

What is claimed is:

1. A method of cleaving a semiconductor wafer into individual devices, said wafer comprising a substrate, at least a portion of one surface of which is metallized, and a plurality of semiconductor layers deposited on at least a portion of the opposite surface, at least one of which layers, when appropriately biased, generates coherent electromagnetic radiation, which method includes:
   (a) forming channels of substantially parallel sidewalls about 1 to 4 mils deep in the substrate, said substrate being at least about 6 mils thick;
   (b) etching into the substrate with an anisotropic etchant to a depth sufficient to form V-grooves in the bottom of the channels said V-grooves terminating at a point before reaching the said one layer;
   (c) mechanically cleaving the wafer including the said one layer along the etched grooves to form bars of diodes, thereby generating substantially damage-free lasing facets along the plane of cleaving the bars of diodes being of substantially equal width; passivating said lasing facets; and further mechanically cleaving said bars of diodes into individual devices.

2. The method of claim 2 in which the wafer is about 6 to 10 mils thick.

3. The method of claim 1 in which the V-grooves are etched to a depth of about 1 to 3 mils deeper than the bottom of the channels.

4. The method of claim 1 in which the semiconductor wafer comprises a substrate of gallium arsenide and layers of gallium arsenide and gallium aluminum arsenide.

5. The method of claim 4 in which the anisotropic etchant comprises a solution of $H_2SO_4$, $H_2O_2$ and $H_2O$.

6. The method of claim 5 in which the etchant comprises $1H_2SO_4$-$8H_2O_2$-$1H_2O$ by volume.

7. The method of claim 1 in which the V-grooves have sidewalls at an angle of at least about 45° with respect to the plane of the wafer.

8. A method of cleaving a wafer into bars of diodes, said wafer comprising a substrate, at least a portion of which is metallized, and a plurality of semiconductor layers deposited on at least a portion of the opposite surface, at least one of which layers, when appropriately biased, generates coherent electromagnetic radiation, which method comprises:
  (a) forming channels of substantially parallel side walls about 1 to 4 mils deep in the substrate;
  (b) etching into the substrate with an anisotropic etchant to a depth sufficient to form V-grooves in the bottom of the channels said V-grooves terminating at a point before reacing the said one layer; and
  (c) mechanically cleaving the wafer including the said one layer along the etched grooves to form bars of diodes, thereby generating substantially damage-free lsing facets along the plane of cleaving the bars of diodes being of substantially equal width.

9. The method of claim 8 in which the wafer is at least about 6 mils thick.

10. The method of claim 9 in which the wafer is about 6 to 10 mils thick.

11. The method of claim 10 in which the V-grooves are etched to a depth of about 1 to 3 mils deeper than the bottom of the channels.

12. The method of claim 8 in which the semiconductor wafer comprises a substrate of gallium arsenide and layers of gallium arsenide and aluminum gallium arsenide.

13. The method of claim 12 in which the anisotropic etchant comprises a solution of $H_2SO_4$, $H_2O_2$ and $H_2O$.

14. The method of claim 13 in which the etchant comprises $1H_2SO_4$-$8H_2O_2$-$1H_2O$ by volume.

15. The method of claim 8 in which the V-grooves have sidewalls at an angle of at least about 45° with respect to the plane of the wafer.

16. The method set forth in claim 1 wherein said further mechanical cleaving of the bars of diodes into individual devices is substantially perpendicular to said lasing facets.

17. The method set forth in claims 8 or 15 wherein said V-grooves are etched into the (001) surface of, and in the <001> direction, off the gallium arsenide substrate.

* * * * *